(12) United States Patent
Anderson

(10) Patent No.: US 11,575,258 B2
(45) Date of Patent: Feb. 7, 2023

(54) DEVICE AND METHOD FOR ELECTROSTATIC DISCHARGE (ESD) PROTECTION

(71) Applicant: NXP B.V., Eindhoven (NL)

(72) Inventor: Alma Anderson, Chandler, AZ (US)

(73) Assignee: NXP B.V., Eindhoven (NL)

( * ) Notice: Subject to any disclaimer, the term of this patent is extended or adjusted under 35 U.S.C. 154(b) by 330 days.

(21) Appl. No.: 16/898,392

(22) Filed: Jun. 10, 2020

(65) Prior Publication Data
US 2021/0391714 A1     Dec. 16, 2021

(51) Int. Cl.
*H02H 9/04*     (2006.01)
*H01L 27/02*     (2006.01)

(52) U.S. Cl.
CPC ......... *H02H 9/046* (2013.01); *H01L 27/0266* (2013.01)

(58) Field of Classification Search
CPC ............................. H02H 9/046; H01L 27/0266
See application file for complete search history.

(56) References Cited

U.S. PATENT DOCUMENTS

| | | | |
|---|---|---|---|
| 5,701,024 A | 12/1997 | Watt | |
| 6,125,021 A * | 9/2000 | Duwury | ............. H01L 27/0266 361/56 |
| 6,621,673 B2 | 9/2003 | Lin et al. | |
| 8,922,960 B2 * | 12/2014 | Van Wijmeersch | ... H02H 9/046 361/56 |
| 2008/0029820 A1 * | 2/2008 | Disney | ................ H01L 27/0251 257/355 |
| 2019/0326749 A1 * | 10/2019 | Lai | ...................... H01L 27/0924 |
| 2020/0091136 A1 | 3/2020 | de Raad | |

FOREIGN PATENT DOCUMENTS

TW                488056 B         5/2002

* cited by examiner

*Primary Examiner* — Kyle J Moody
*Assistant Examiner* — Lakaisha Jackson

(57) ABSTRACT

Embodiments of an electrostatic discharge (ESD) protection device and a method for operating an ESD protection device are described. In one embodiment, an ESD protection device includes a primary ESD protection unit electrically connected to a first node and to a second node and configured to shunt current in response to an ESD pulse received between the first and second nodes and a secondary ESD protection unit electrically connected to the primary ESD protection unit and to the second node and configured to shunt current in response to the ESD pulse to keep an output voltage of the ESD protection device to be within a safe operating voltage range of a device to be protected. Other embodiments are also described.

10 Claims, 3 Drawing Sheets

DEVICE AND METHOD FOR ELECTROSTATIC DISCHARGE (ESD) PROTECTION

BACKGROUND

Embodiments of the invention relate generally to electronic hardware and methods for operating electronic hardware, and, more particularly, to electrostatic discharge (ESD) protection devices and methods for providing ESD protection.

Electrostatic discharge is a sudden flow of electricity that can be caused by a buildup of static electricity. An ESD protection device can be used to shunt ESD current to prevent thermal damage in a device. For example, an ESD protection device can be integrated onto an electrical device, such as an integrated circuit (IC) chip, to provide a low impedance channel to prevent thermal damage to components of the electrical device. The operating characteristics of an ESD protection device (e.g., the output voltage when shunting ESD current) can affect the performance of the ESD protection device.

SUMMARY

Embodiments of an ESD protection device and a method for operating an ESD protection device are described. In an embodiment, an ESD protection device includes a primary ESD protection unit electrically connected to a first node and to a second node and configured to shunt current in response to an ESD pulse received between the first and second nodes and a secondary ESD protection unit electrically connected to the primary ESD protection unit and to the second node and configured to shunt current in response to the ESD pulse to keep an output voltage of the ESD protection device to be within a safe operating voltage range of a device to be protected. Other embodiments are also described.

In an embodiment, an output voltage of the primary ESD protection unit is higher than the safe operating voltage range of the device to be protected.

In an embodiment, the secondary ESD protection unit includes a plurality of resistors and a plurality of transistors.

In an embodiment, the secondary ESD protection unit includes a series resistor electrically connected to the primary ESD protection unit, a capacitive coupling circuit electrically connected to the series resistor, and a snap back circuit electrically connected to the capacitive coupling circuit and to the second node.

In an embodiment, the snap back circuit includes a transistor device, a first resistor electrically connected to a gate terminal of the transistor device and to a source terminal of the transistor device, and a second resistor electrically connected to a body of the transistor device and to the source terminal of the transistor device.

In an embodiment, the transistor device includes an NMOS transistor.

In an embodiment, a drain terminal of the NMOS transistor is electrically connected to the series resistor.

In an embodiment, the source terminal of the NMOS transistor is electrically connected to the second node.

In an embodiment, the capacitive coupling circuit includes a PMOS transistor.

In an embodiment, a gate terminal of the PMOS transistor is electrically connected to a gate terminal of the NMOS transistor.

In an embodiment, a source terminal and a drain terminal of the PMOS transistor are electrically connected to the series resistor and to the NMOS transistor.

In an embodiment, the device to be protected is electrically connected to the second node.

In an embodiment, an ESD protection device includes a primary ESD protection unit electrically connected to a first node and to a second node, where an output voltage of the primary ESD protection unit is higher than a safe operating voltage range of a device to be protected, and a secondary ESD protection unit electrically connected to the primary ESD protection unit and to the second node and configured to shunt current in response to an ESD pulse received between the first and second nodes to keep an output voltage of the ESD protection device to be within the safe operating voltage range of the device to be protected. The secondary ESD protection unit includes a series resistor electrically connected to the primary ESD protection unit, a capacitive coupling circuit electrically connected to the series resistor, and a snap back circuit electrically connected to the capacitive coupling circuit and to the second node.

In an embodiment, the snap back circuit includes an NMOS transistor, a first resistor electrically connected to a gate terminal of the NMOS transistor and to a source terminal of the NMOS transistor, and a second resistor electrically connected to a body of the NMOS transistor and to the source terminal of the NMOS transistor.

In an embodiment, a drain terminal of the NMOS transistor is electrically connected to the series resistor, and wherein the source terminal of the NMOS transistor is electrically connected to the second node.

In an embodiment, the capacitive coupling circuit includes a PMOS transistor, where a gate terminal of the PMOS transistor is electrically connected to the gate terminal of the NMOS transistor, and a source terminal and a drain terminal of the PMOS transistor are electrically connected to the series resistor and to the NMOS transistor.

In an embodiment, the capacitive coupling circuit includes a capacitor.

In an embodiment, the capacitive coupling circuit includes a reverse biased diode.

In an embodiment, the device to be protected is electrically connected to the second node.

In an embodiment, a method for operating an ESD protection device involves receiving an ESD pulse at the ESD protection device, in response to the ESD pulse, shunting current using a primary ESD protection unit of the ESD protection device, and in response to shunting current using the primary ESD protection unit, shunting current using a secondary ESD protection unit of the ESD protection device to keep an output voltage of the ESD protection device to be within a safe operating voltage range of a device to be protected.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
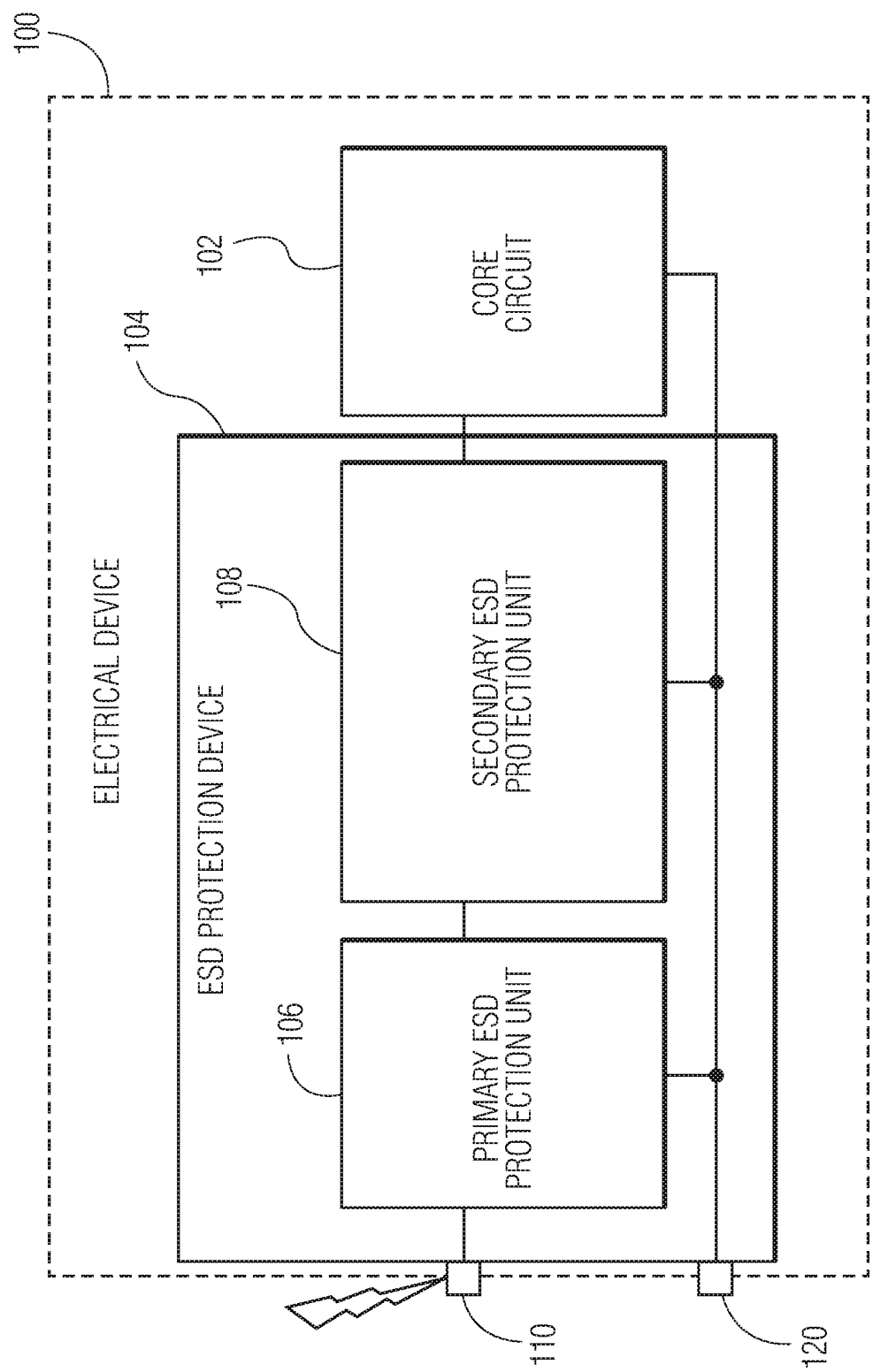
FIG. 1 is a schematic block diagram of an electrical device in accordance with an embodiment of the invention.

FIG. 1 is a schematic block diagram of an electrical device 100 in accordance with an embodiment of the invention. In the embodiment depicted in FIG. 1, the electrical device includes a core circuit 102 and an ESD protection device 104 that includes a primary ESD protection unit 106 and a secondary ESD protection unit 108. The ESD protection device 104 is used to protect the core circuit during an ESD event, which may be an ESD test or an actual ESD strike. The core circuit and the ESD protection device are both electrically connected to first and second nodes 110, 120. The first and second nodes 110, 120 are coupled to different voltages. In some embodiments, the first node 110 is electrically connected to a positive voltage and the second node 120 is electrically connected to a voltage that is lower than the voltage at the first node 110 or vice versa. In some embodiments, the first node 110 and/or the second node 120 are electrically connected to a fixed voltage. For example, the second node is electrically connected to ground (zero volt). The electrical device can be used in various applications, such as automotive applications, communications applications, industrial applications, medical applications, computer applications, and/or consumer or appliance applications. In some embodiments, the electrical device is an IC device. For example, the electrical device can be implemented in a substrate, such as a semiconductor wafer or a printed circuit board (PCB). Although the electrical device is shown in FIG. 1 as including the core circuit 102 and the ESD protection device 104, in other embodiments, the electrical device may include more or less circuit elements to implement more or less functions.

In the embodiment depicted in FIG. 1, the core circuit 102 is a device to be protected by the ESD protection device 104 in case of an ESD event, such as an ESD pulse received between the first and second nodes 110, 120. In some embodiments, the core circuit is electrically connected to the second node 120, which may be connected to a fixed voltage (e.g., electrical ground). The core circuit typically includes one or more internal circuit components, such as transistors, capacitors, or diodes, which are susceptible to ESD strikes. Examples of the core circuit include, but are not limited to, microcontrollers, transceivers, and switching circuits, which can be used for, for example, in vehicle control or communications, identification, wireless communications, and/or lighting control. In an embodiment, the core circuit is packaged as a semiconductor IC chip.

The ESD protection device 104 protects the core circuit 102 during an ESD event, such as an ESD pulse received between the first and second nodes 110, 120. The ESD protection device can be used to protect a power supply domain of the electrical device 100. For example, the ESD protection device may be connected to a power supply rail of the electrical device and may shunt ESD current to protect the core circuit in response to an ESD pulse. The ESD protection device can be implemented by suitable semiconductor devices. In some embodiments, the ESD protection device is an IC device and the first and second nodes are electrical terminals of the IC device, such as electrical contact pads or electrical contact pins. For example, the ESD protection device can be implemented in a substrate, such as a semiconductor wafer or a PCB. In some embodiments, the ESD protection device is implemented as a separate IC device as the core circuit 102. For example, the ESD protection device and the core circuit are implemented in separate substrates such as separate wafers or separate PCBs. In the embodiment depicted in FIG. 1, the ESD protection device includes the primary ESD protection unit 106 and the secondary ESD protection unit 108. In the embodiment depicted in FIG. 1, the primary ESD protection unit is electrically connected to the first node 110 and to the second node 120 and configured to shunt current in response to an ESD pulse received between the first and second nodes. In some embodiments, the output voltage of the primary ESD protection unit is higher than the safe operating voltage range of the core circuit. For example, the output voltage of the primary ESD protection unit is 8 volts (V), which is higher than the safe operating voltage range (e.g., 0V-6V) of the core circuit. In the embodiment depicted in FIG. 1, the secondary ESD protection unit is electrically connected to the primary ESD protection unit and to the second node and configured to shunt current in response to the ESD pulse to keep the output voltage of the ESD protection device to be within the safe operating voltage range of the core circuit 102. For example, the output voltage of the secondary ESD protection unit is 5V, which is within the safe operating voltage range (e.g., 0V-6V) of the core circuit. However, the output voltage of the primary ESD protection unit, the output voltage of the secondary ESD protection unit, and/or the safe operating voltage range of the core circuit may be different from the voltage examples. Although the primary ESD protection unit, the secondary ESD protection unit, and the core circuit are shown in FIG. 1 as being connected in a certain manner, in other embodiments, the primary ESD protection unit, the secondary ESD protection unit, and the core circuit are connected differently from the embodiment depicted in FIG. 1. For example, the primary ESD protection unit may be connected to the second node through one electrical connection while the secondary ESD protection unit or the core circuit may be connected to the second node through a different electrical connection.

In an example operation of the ESD protection device 104, the primary ESD protection unit 106 shunts current in response to an ESD pulse received at the ESD protection device. In response to shunting current using the primary ESD protection unit, the secondary ESD protection unit 108 shunts current to keep the output voltage of the ESD protection device to be within the safe operating voltage range of the core circuit 102.

An ESD protection device that generates an output voltage that is higher than the safe operating voltage range of a circuit to be protected can cause electrical degradations in the circuit to be protected. Compared to an ESD protection device that generates an output voltage that is higher than the safe operating voltage range of a circuit to be protected, the ESD protection device 104 in the embodiment depicted in FIG. 1 generates an output voltage that is within the safe operating voltage range of the core circuit 102. Specifically, the secondary ESD protection unit 108 of the ESD protection device 104 shunts current to keep the output voltage of the ESD protection device to be within the safe operating voltage range of the core circuit 102. Consequently, the degradations in the core circuit 102 caused by overvoltage from the ESD protection device 104 can be reduced or even avoided.

Figure 2:
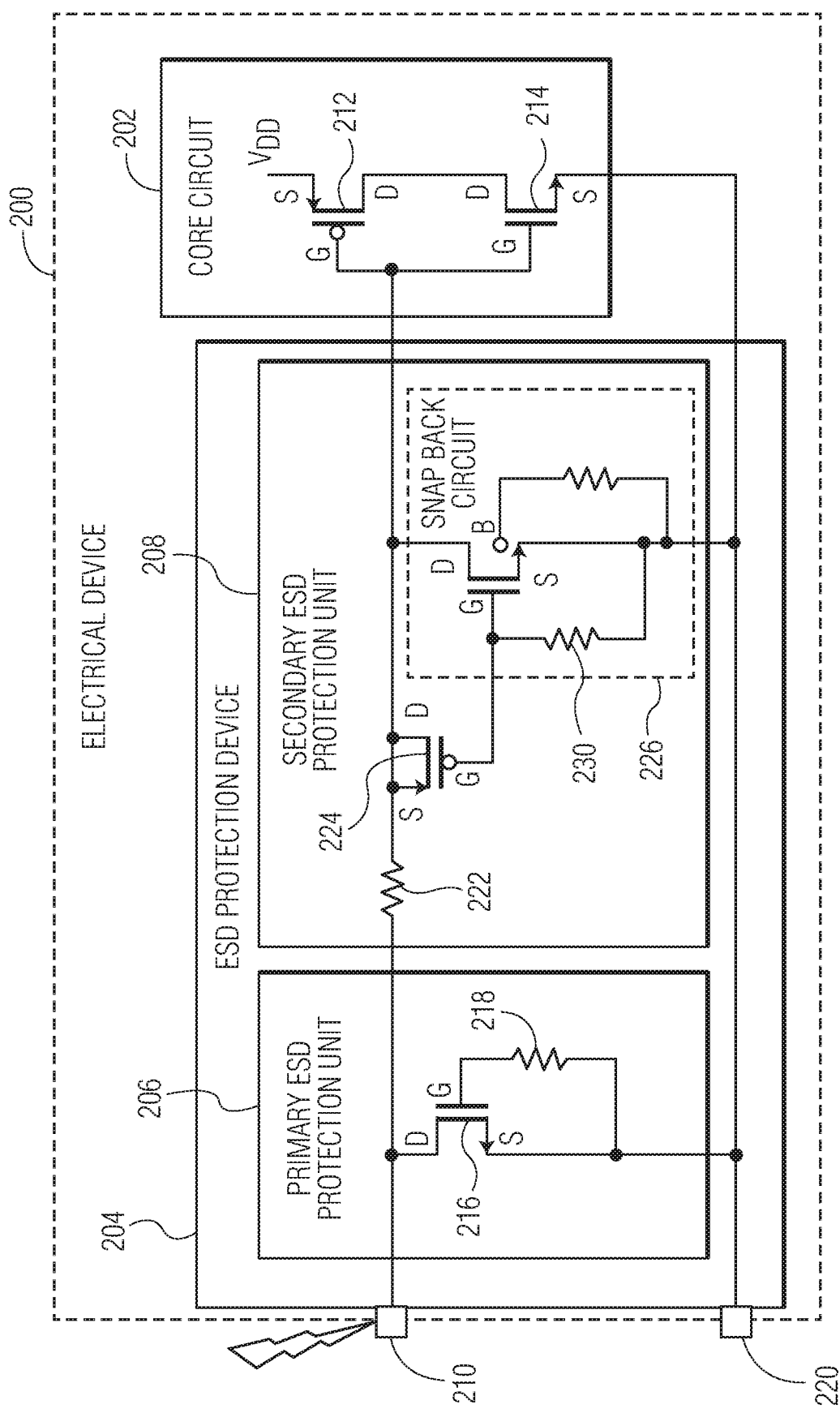
FIG. 2 depicts an embodiment of the electrical device depicted in FIG. 1.

FIG. 2 depicts an embodiment of the electrical device 100 depicted in FIG. 1. In the embodiment depicted in FIG. 2, an electrical device 200 includes a core circuit 202 and an ESD protection device 204 that includes a primary ESD protection unit 206 electrically connected to a first node 210 and to a second node 220 and a secondary ESD protection unit 208 electrically connected to the primary ESD protection unit 206 and to the second node 220. In some embodiments, the second node 220 is electrically connected to a fixed voltage. For example, the second node 220 is electrically connected to ground (zero volt). The electrical device 200 depicted in FIG. 2 is a possible implementation of the electrical device 100 depicted in FIG. 1. In particular, the core circuit 202, the ESD protection device 204, the primary ESD protection unit 206, the secondary ESD protection unit 208, and the first and second nodes 210, 220 depicted in FIG. 2 are embodiments of the core circuit 102, the ESD protection device 104, the primary ESD protection unit 106, the secondary ESD protection unit 108, and the first and second nodes 110, 120 depicted in FIG. 1, respectively. However, the electrical device 100 depicted in FIG. 1 can be implemented differently from the electrical device 200 depicted in FIG. 2. For example, although the secondary ESD protection unit 208 is shown in FIG. 2 as being implemented as a triggered NPN snap back circuit, in other embodiments, the secondary ESD protection unit 208 may be implemented differently from the embodiment depicted in FIG. 2. For example, the secondary ESD protection unit 208 may be implemented as a triggered silicon controlled rectifier (SCR) stack.

In an example operation of the ESD protection device 204, the primary ESD protection unit 206 shunts current in response to an ESD pulse received at the ESD protection device. In response to shunting current using the primary ESD protection unit, the secondary ESD protection unit 208 shunts current to keep an output voltage of the ESD protection device to be within a safe operating voltage range of the core circuit.

In the embodiment depicted in FIG. 2, the core circuit 202 includes a p-channel metal-oxide-semiconductor field-effect transistor (MOSFET) (PMOS) transistor 212 and an n-channel MOSFET (NMOS) transistor 214 that are connected in series between an input voltage, $V_{DD}$, and a fixed voltage (e.g., electrical ground) that is connected to the second node 220. The input voltage, $V_{DD}$, may be a positive voltage that is input into the core circuit through an input terminal (e.g., an electrical contact pad or an electrical contact pin) of the electrical device 200. Specifically, the source terminal (S) of the PMOS transistor 212 is electrically connected to the input voltage, $V_{DD}$, the gate terminal (G) of the PMOS transistor 212 is electrically connected to the secondary ESD protection unit 208, and the drain terminal (D) of the PMOS transistor 212 is electrically connected to the drain terminal (D) of the NMOS transistor 214. The source terminal (S) of the NMOS transistor 214 is electrically connected to the second node 220, and the gate terminal (G) of the NMOS transistor 214 is electrically connected to the secondary ESD protection unit 208. In some embodiments, the input voltage, $V_{DD}$, cannot be used to dump an ESD pulse/current, or the impedance of the input voltage, $V_{DD}$, is too high to sink the ESD current at a safe voltage.

In the embodiment depicted in FIG. 2, the primary ESD protection unit 206 includes an NMOS transistor 216 electrically connected to the first node 210 and a resistor 218 that is electrically connected to the NMOS transistor 216 and to the second node 220. Specifically, the source terminal (S) of the NMOS transistor 216 is electrically connected to the second node 220, the gate terminal (G) of the NMOS transistor 216 is electrically connected to the resistor 218, and the drain terminal (D) of the NMOS transistor 216 is electrically connected to the first node 210. The primary ESD protection unit is configured to shunt current in response to an ESD pulse received between the first and second nodes. The output voltage of the primary ESD protection unit is higher than the safe operating voltage range of the core circuit 202 (e.g., the threshold voltages of the PMOS transistor 212 and the NMOS transistor 214).

In the embodiment depicted in FIG. 2, the secondary ESD protection unit 208 includes a series resistor 222 that is electrically connected to the primary ESD protection unit 206, a capacitive coupling circuit 224 that is electrically connected to the series resistor 222 and is implemented as a PMOS transistor, and a snap back circuit 226 that is electrically connected to the capacitive coupling circuit 224 and to the second node 220. In the embodiment depicted in FIG. 2, the snap back circuit 226 includes an NMOS transistor 228, a gate to source resistor 230, and a body to source resistor 232. The gate to source resistor 230 and the body to source resistor 232 are used to control the trigger voltage and the holding voltage of the secondary ESD protection unit 208. The advantage of using the triggered snap back circuit 226 over a dynamic only device is that the snap back circuit can protect against trapped reflections that do not reach the trigger voltage of the primary ESD protection. The series resistor 222 can be optimized to limit on chip power dissipation, which allow the secondary ESD protection unit 208 to be implemented in a smaller substrate area. Consequently, the ESD protection device 204 can be used in devices with limited substrate sizes, such as system on a chip (SoC) devices. In addition, the resistance of the gate to source resistor 230 and the capacitance to the gate terminal (G) of the NMOS transistor 228 can be optimized to prevent triggering with the normal input voltage but trigger when the input voltage exceeds the safe operating voltage range of the core circuit 202. The high resistance between the body terminal (B) and the source terminal (S) of the NMOS transistor 228 allows current in the NMOS channel to build up sufficient voltage between the body terminal (B) and the source terminal (S) of the NMOS transistor 228 by triggering snapback of the parasitic NPN transistor of the NMOS transistor 228. Although the capacitive coupling circuit is implemented as a PMOS transistor in the embodiment depicted in FIG. 2, in another embodiment, the capacitive coupling circuit is implemented as a capacitor. In yet another embodiment, the capacitive coupling circuit is implemented as a reverse biased diode.

In the embodiment depicted in FIG. 2, the series resistor 222 is electrically connected to the first node 210, to the source terminal (S) and the drain terminal (D) of the PMOS transistor 224, to the drain terminal (D) of the NMOS transistor 228, and to the gate terminals (G) of the PMOS transistor 212 and the NMOS transistor 214. In some embodiments, the series resistor 222 is a variable resistor with variable resistance. In some embodiments, the series resistor 222 is configured to limit current into the secondary ESD protection unit 208 and to pass expected input signals received at the first node 210. In an embodiment, when the secondary ESD protection unit keeps the output voltage of the ESD protection device 204 to be within the safe operating voltage of the core circuit 202, the series resistor 222 (e.g., the resistance of the series resistor 222) is set or adjusted to limit the current while not slowing down the core circuit. In this embodiment, the resistance of the series resistor 222 is set to a specific resistance value to limit the current while not slowing down the core circuit. In another embodiment, the ESD protection device 204 may include a controller (e.g., a microcontroller) to control the series resistor 222.

In the embodiment depicted in FIG. 2, the gate to source resistor 230 is electrically connected to the gate terminals (G) of the PMOS transistor 224 and the NMOS transistor 228 and to the second node 220. The body to source resistor is electrically connected to the body terminal (B) of the NMOS transistor 228 and to the second node 220. The snap back circuit 226 is configured to keep or hold the output voltage of the ESD protection device 204, which is the input voltage to the gate terminals (G) of the PMOS transistor 212 and the NMOS transistor 214, within the safe operating voltage range of the PMOS transistor 212 and the NMOS transistor 214. In some embodiments, the capacitance to the gate terminal (G) of the NMOS transistor 228 and the gate to source resistance of the NMOS transistor 228 is tuned to not trigger by the expected voltage range of input signals and to trigger when the input swings above (i.e., higher than) the safe operating voltage range of the PMOS transistor 212 and the NMOS transistor 214. In an embodiment, the NMOS transistor 228 is configured to have an NPN snap back voltage that is below (i.e., lower than) the upper limit of the safe operating voltage range of the PMOS transistor 212 and the NMOS transistor 214 but above (i.e., higher than) the expected maximum input signal voltage. In some embodiments, the NMOS transistor 228 and the series resistor 222 are configured to hold the triggered voltage within the safe operating voltage range of the PMOS transistor 212 and the NMOS transistor 214 and to remain in snap back when the applied voltage is higher than the safe operating voltage range of the PMOS transistor 212 and the NMOS transistor 214. For example, the size or dimension of the NMOS transistor 228 and the series resistor 222 are set to hold the triggered voltage within the safe operating voltage range of the PMOS transistor 212 and the NMOS transistor 214. The body to source resistance may be adjusted to control the minimum holding current of the snap back circuit and to allow the dynamic NMOS body current to trigger the snap back circuit. By using the isolated NMOS transistor 228 with the gate to source resistor 230 and the body to source resistor 232 and sufficient capacitive coupling, the NMOS transistor 228 can be turned on (i.e., being conductive) to trigger snapback of the parasitic NPN transistor of the NMOS transistor 228 without having to reach the avalanche breakdown of the drain to body junction of the NMOS transistor 228.

Compared to an ESD protection device that generates an output voltage that is higher than the safe operating voltage range of a circuit to be protected, the ESD protection device 204 in the embodiment depicted in FIG. 2 generates an output voltage that is within the safe operating voltage range of the core circuit 202 (e.g., the threshold voltages of the PMOS transistor 212 and the NMOS transistor 214). Specifically, the secondary ESD protection unit 208 of the ESD protection device shunts current to keep the output voltage of the ESD protection device to be within the safe operating voltage range of the core circuit 202. Consequently, the degradations in the core circuit 202 caused by overvoltage from the ESD protection device 204 can be eliminated. In addition, compared to an ESD protection device that operates based on break down of a junction diode or based on a low threshold voltage of a MOS transistor to protect a circuit to be protected, the ESD protection device 204 in the embodiment depicted in FIG. 2 can turned on the NMOS transistor 228 of the secondary ESD protection unit 208 to trigger snapback of the parasitic NPN transistor of the NMOS transistor 228 without having to reach the avalanche breakdown of the drain to body junction of the NMOS transistor 228. Further, an ESD protection device that uses a dynamic trigger for a NMOS secondary protection unit may work well for classic ESD pulses, a dynamic trigger based ESD protection device does not work well for an ESD pulse with a small amplitude but a long duration because the dynamic trigger based ESD protection device turns off with an Resistor-Capacitor (RC) time constant. Compared to an ESD protection device that uses a dynamic trigger for a NMOS secondary protection unit, the ESD protection device 204 in the embodiment depicted in FIG. 2 operates by triggering snap back of the parasitic NPN transistor of the NMOS transistor 228, which can stay on or active as long as the elevated voltage is present.

Figure 3:
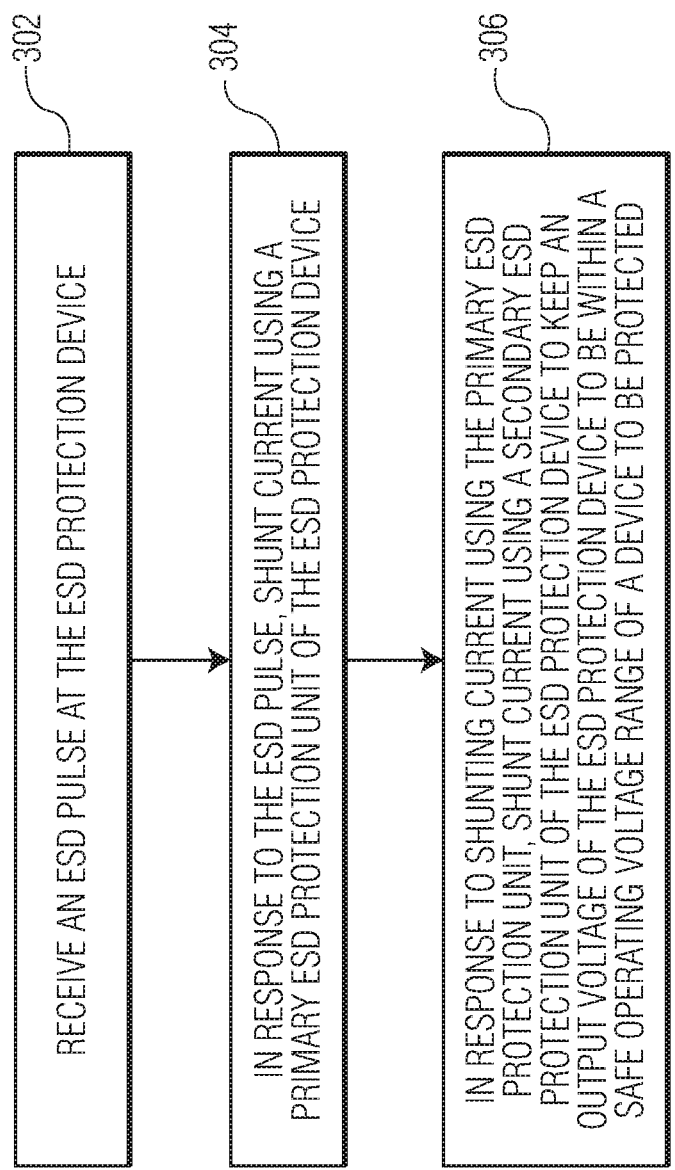
FIG. 3 is a process flow diagram that illustrates a method for operating an ESD protection device in accordance with an embodiment of the invention.

FIG. 3 is a process flow diagram that illustrates a method for operating an ESD protection device in accordance with an embodiment of the invention. At block 302, an ESD pulse is received at the ESD protection device. At block 304, in response to the ESD pulse, current is shunted using a primary ESD protection unit of the ESD protection device. At block 306, in response to shunting current using the primary ESD protection unit, current is shunted using a secondary ESD protection unit of the ESD protection device to keep an output voltage of the ESD protection device to be within a safe operating voltage range of a device to be protected. The ESD protection device may be the same as or similar to the ESD protection device 104 depicted in FIG. 1 and/or the ESD protection device 204 depicted in FIG. 2. The primary ESD protection unit may be the same as or similar to the primary ESD protection unit 106 depicted in FIG. 1 and/or the primary ESD protection unit 206 depicted in FIG. 2. The secondary ESD protection unit may be the same as or similar to the secondary ESD protection unit 108 depicted in FIG. 1 and/or the secondary ESD protection unit 208 depicted in FIG. 2.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising:
   a primary ESD protection unit electrically connected to a first node and to a second node and configured to shunt current in response to an ESD pulse received between the first and second nodes; and
   a secondary ESD protection unit electrically connected to the primary ESD protection unit and to the second node and configured to shunt current in response to the ESD pulse to keep an output voltage of the ESD protection device to be within a predefined voltage range, wherein the secondary ESD protection unit comprises:
      a series resistor electrically connected to the primary ESD protection unit;
      a capacitive coupling circuit electrically connected to the series resistor; and
      a snap back circuit electrically connected to the capacitive coupling circuit and to the second node, the snap back circuit comprising:
         an NMOS transistor having a drain terminal that is electrically connected to the series resistor;
         a first resistor electrically connected to a gate terminal of the NMOS transistor and to a source terminal of the NMOS transistor; and
         a second resistor electrically connected to a body of the NMOS transistor and to the source terminal of the NMOS transistor.

2. The ESD protection device of claim 1, wherein an output voltage of the primary ESD protection unit is higher than the predefined voltage range.

3. The ESD protection device of claim 1, wherein the source terminal of the NMOS transistor is electrically connected to the second node.

4. The ESD protection device of claim 1, wherein the capacitive coupling circuit comprises a PMOS transistor.

5. The ESD protection device of claim 4, wherein a gate terminal of the PMOS transistor is electrically connected to the gate terminal of the NMOS transistor.

6. The ESD protection device of claim 5, wherein a source terminal and a drain terminal of the PMOS transistor are electrically connected to the series resistor and to the NMOS transistor.

7. The ESD protection device of claim 1, wherein a device to be protected is electrically connected to the second node.

8. An electrostatic discharge (ESD) protection device, the ESD protection device comprising:
   a primary ESD protection unit electrically connected to a first node and to a second node; and
   a secondary ESD protection unit electrically connected to the primary ESD protection unit and to the second node and configured to shunt current in response to an ESD pulse received between the first and second nodes to keep an output voltage of the ESD protection device to be within a predetermined voltage range, wherein the secondary ESD protection unit comprises:
      a series resistor electrically connected to the primary ESD protection unit;
      a capacitive coupling circuit electrically connected to the series resistor, the capacitive coupling circuit comprising a PMOS transistor; and
      a snap back circuit electrically connected to the capacitive coupling circuit and to the second node, wherein the snap back circuit comprises:
         an NMOS transistor, wherein a gate terminal of the PMOS transistor is electrically connected to a gate terminal of the NMOS transistor, and a source terminal and a drain terminal of the PMOS transistor are electrically connected to the series resistor and to the NMOS transistor;
         a first resistor electrically connected to the gate terminal of the NMOS transistor and to a source terminal of the NMOS transistor; and
         a second resistor electrically connected to a body of the NMOS transistor and to the source terminal of the NMOS transistor.

9. The ESD protection device of claim 8, wherein a drain terminal of the NMOS transistor is electrically connected to the series resistor, and wherein the source terminal of the NMOS transistor is electrically connected to the second node.

10. The ESD protection device of claim 8, wherein a device to be protected is electrically connected to the second node.

* * * * *